United States Patent
Wu et al.

(10) Patent No.: US 12,527,049 B2
(45) Date of Patent: Jan. 13, 2026

(54) TRANSISTOR WITH FIN STRUCTURE AND NANOSHEET AND FABRICATING METHOD OF THE SAME

(71) Applicant: UNITED MICROELECTRONICS CORP., Hsin-Chu (TW)

(72) Inventors: Ching-In Wu, Taipei (TW); Yu-Ming Lin, Tainan (TW); Cheng-Tung Huang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 469 days.

(21) Appl. No.: 18/077,203

(22) Filed: Dec. 7, 2022

(65) Prior Publication Data
US 2024/0162291 A1    May 16, 2024

(30) Foreign Application Priority Data
Nov. 10, 2022 (TW) .................................. 111143005

(51) Int. Cl.
    *H10D 62/10*       (2025.01)
    *H10D 30/62*       (2025.01)
    *H10D 30/67*       (2025.01)
    *H10D 64/01*       (2025.01)

(52) U.S. Cl.
CPC ....... *H10D 62/121* (2025.01); *H10D 30/6215* (2025.01); *H10D 30/6735* (2025.01); *H10D 30/6757* (2025.01); *H10D 64/017* (2025.01)

(58) Field of Classification Search
CPC .... H10D 30/014; H10D 30/024; H10D 30/43; H10D 62/151; H10D 62/116; H10D 62/118; H10D 62/121; H10D 84/0158; H10D 84/834
See application file for complete search history.

(56) References Cited

U.S. PATENT DOCUMENTS

| | | | |
|---|---|---|---|
| 2011/0117732 A1* | 5/2011 | Bauer | ............... H01L 21/02639 438/507 |
| 2018/0175035 A1* | 6/2018 | Yang | ...................... H10D 84/83 |
| 2023/0178553 A1* | 6/2023 | Xie | ...................... H10D 64/018 257/351 |

OTHER PUBLICATIONS

Scotten Jones ,https://semiwiki.com/seimconductor-services/290804-vlsi-symposium-2020-imec-monolithic-cfet/, VLSI Symposium 2020—Imec Monolithic CFET ,Sep. 13, 2020.

* cited by examiner

*Primary Examiner* — Tuan A Hoang
(74) *Attorney, Agent, or Firm* — Winston Hsu

(57) ABSTRACT

A transistor with a fin structure and a nanosheet includes a fin structure. A first gate portion is disposed on the fin structure. A first source/drain layer is disposed at one side of the first gate portion. A first source/drain layer is on the fin structure and extends into the fin structure. A second source/drain layer is disposed at another side of the first gate portion. The second source/drain layer is on the fin structure and extends into the fin structure. A nanosheet is disposed above the first gate portion, between the first source/drain layer and the second source/drain layer, and contacts the first source/drain layer and the second source/drain layer. A second gate portion surrounds the nanosheet.

16 Claims, 6 Drawing Sheets

TRANSISTOR WITH FIN STRUCTURE AND NANOSHEET AND FABRICATING METHOD OF THE SAME

BACKGROUND OF THE INVENTION

1. Field of the Invention

The present invention relates to a transistor structure which can increase current density and a fabricating method of the same, and more particularly to a transistor structure which increases current density by using a fin structure and a nanosheet and a fabricating method of the same.

2. Description of the Prior Art

Metal-oxide semiconductor (MOS) transistor is the most important basic electronic unit in electronic field. With the continuous shrinking of electronic devices, MOS transistors are required to be small and with high operating speed and high stability. In MOS transistors, the current density influences the operating speed and stability of the transistors. The current density is proportional to the width of the gate and inversely proportional to the length of the gate. Therefore, a method to increase the current density of the transistor is to increase the effective width of the gate. Because the current density of a transistor and its speed are directly proportional to the gate width, transistors with higher speed generally require a larger gate width, which means a larger component size. However, as sizes of semiconductor elements continue to decrease, it is necessary to develop a transistor structure that has a high current density and a small size.

SUMMARY OF THE INVENTION

In view of this, the present invention provides a transistor which increases current density by using a fin structure and a nanosheet.

According to a preferred embodiment of the present invention, a transistor with a fin structure and a nanosheet includes a first fin structure. A first gate portion is disposed on the first fin structure. A first source/drain layer is disposed at one side of the first gate portion, wherein, the first source/drain layer is on the first fin structure and extends into the first fin structure. A second source/drain layer is disposed at another side of the first gate portion, wherein the second source/drain layer is on the first fin structure and extends into the first fin structure. A first nanosheet is disposed above the first gate portion, wherein the first nanosheet is disposed between and contacts the first source/drain layer and the second source/drain layer. A second gate portion surrounds the nanosheet.

According to another preferred embodiment of the present invention, a fabricating method of a transistor with a fin structure and a nanosheet, includes providing a fin structure with a dummy gate disposed on the fin structure, two spacers disposed at two sides of the dummy gate, a first embed epitaxial layer and a second embed epitaxial layer respectively embedded within the fin structure at two sides of the dummy gate. Next, a first epitaxial layer and a second epitaxial layer are formed in sequence to cover the fin structure and the dummy gate. Thereafter, two first mask layers are formed. The two first mask layers respectively encapsulate the first epitaxial layer and the second epitaxial layer directly on the first embed epitaxial layer and encapsulate the first epitaxial layer and the second epitaxial layer directly on the second embed epitaxial layer. Later, part of the first epitaxial layer and part of the second epitaxial layer are removed by taking the two first mask layers as a first mask to expose the dummy gate and make the second epitaxial layer which is remained become a nanosheet. Subsequently, the dummy gate is removed to form a recess between the two spacers. Then, a second gate dielectric layer is formed to encapsulate the nanosheet and a first gate dielectric layer is formed to cover the recess. Later, a first gate portion and a second gate portion are formed, wherein the first gate portion fills in the recess, and the second gate portion encapsulates the nanosheet. After forming the first gate portion, a gate electrode is formed to fill up a space between the two first mask layers. Finally, the two first mask layers are removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a fabricating method of a transistor with a fin structure and a nanosheet according to a first preferred embodiment of the present invention, wherein:

FIG. 1 depicts a fin structure with a dummy gate thereon;
FIG. 2 is a fabricating stage in continuous from FIG. 1;
FIG. 3 is a fabricating stage in continuous from FIG. 2;
FIG. 4 is a fabricating stage in continuous from FIG. 3;
FIG. 5 is a fabricating stage in continuous from FIG. 4;
FIG. 6 is a fabricating stage in continuous from FIG. 5;
FIG. 7 is a fabricating stage in continuous from FIG. 6;
FIG. 8 is a fabricating stage in continuous from FIG. 7;
and
FIG. 9 is a fabricating stage in continuous from FIG. 8.

DETAILED DESCRIPTION

Figure 8:
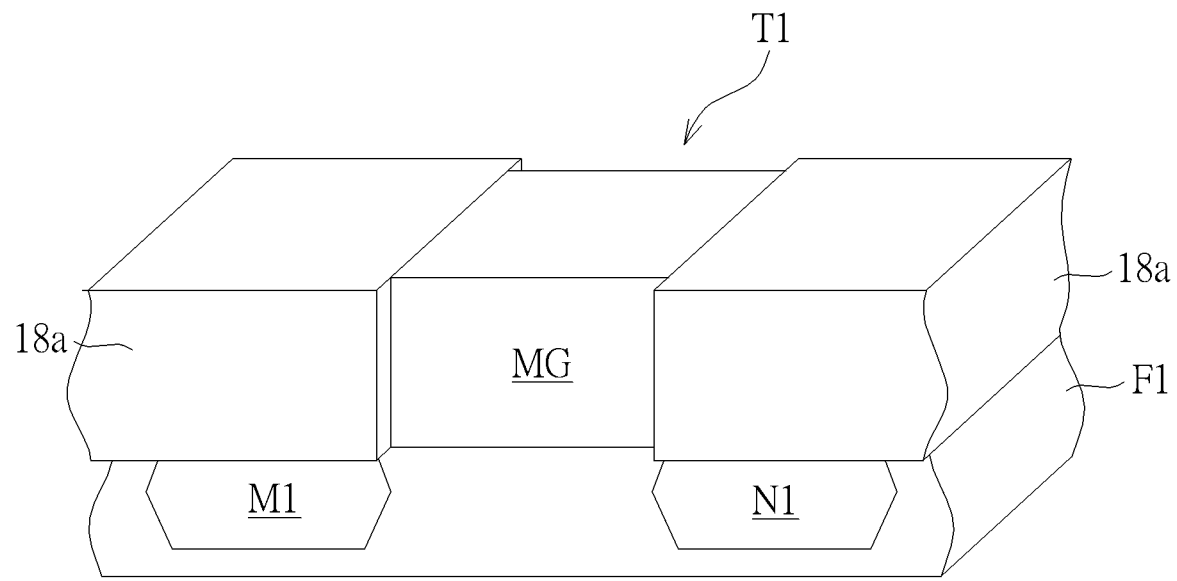
Figure 9:
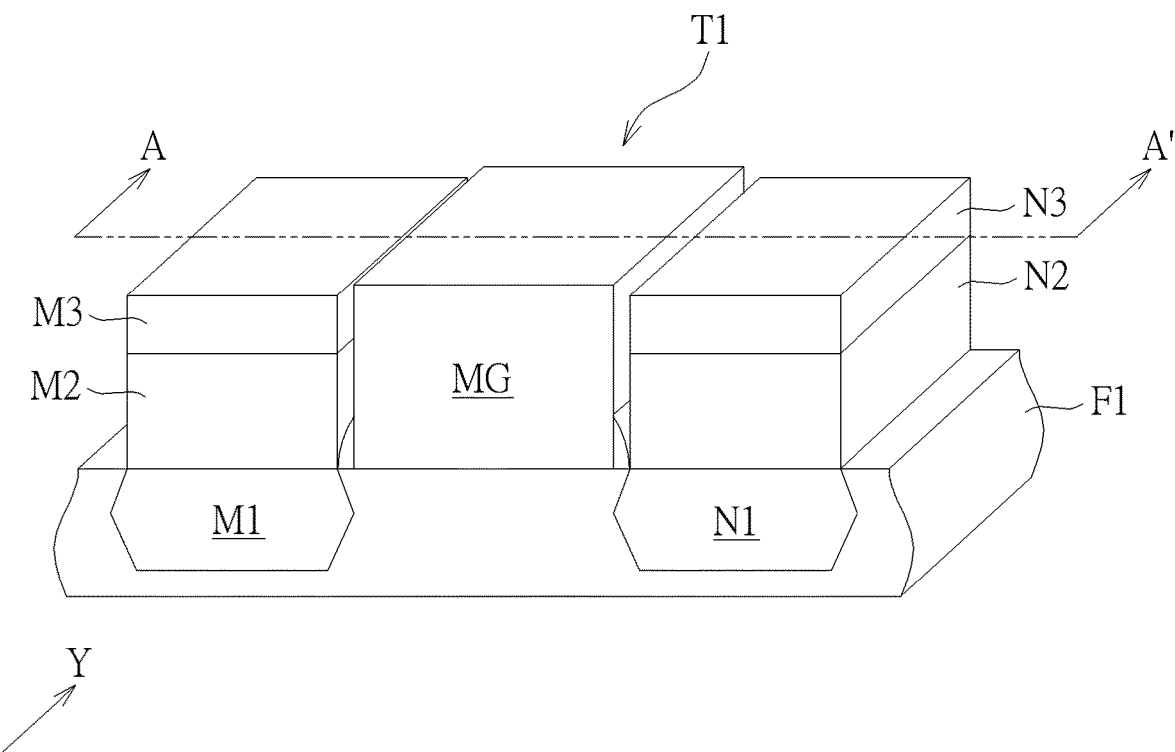
Figure 10:
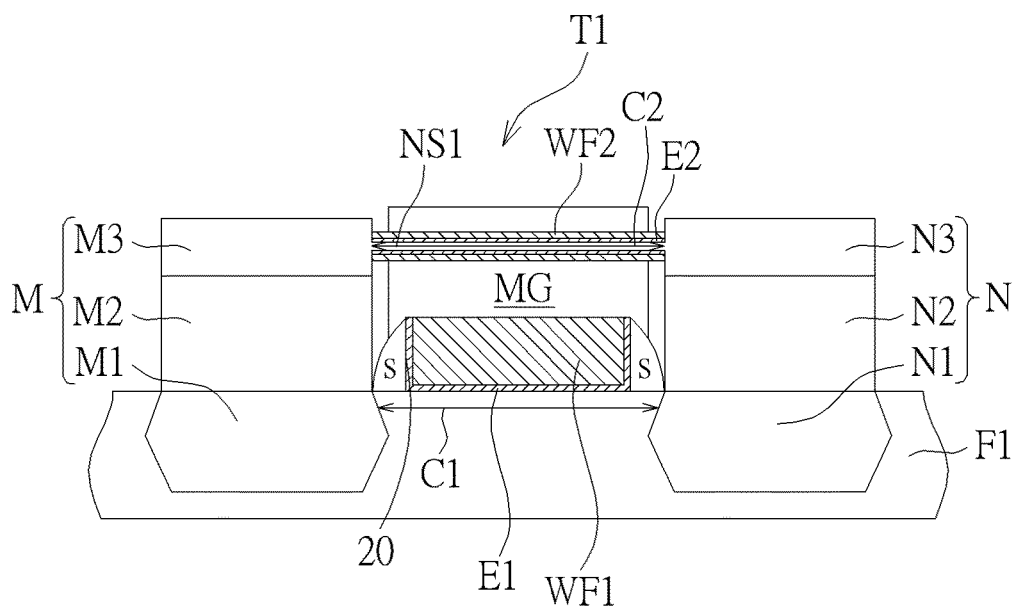
FIG. 10 depicts a sectional view taken along line AA' in FIG. 9.

FIG. 1 to FIG. 9 depict a fabricating method of a transistor with a fin structure and a nanosheet according to a first preferred embodiment of the present invention. FIG. 10 depicts a sectional view taken along line AA' in FIG. 9.

Figure 1:
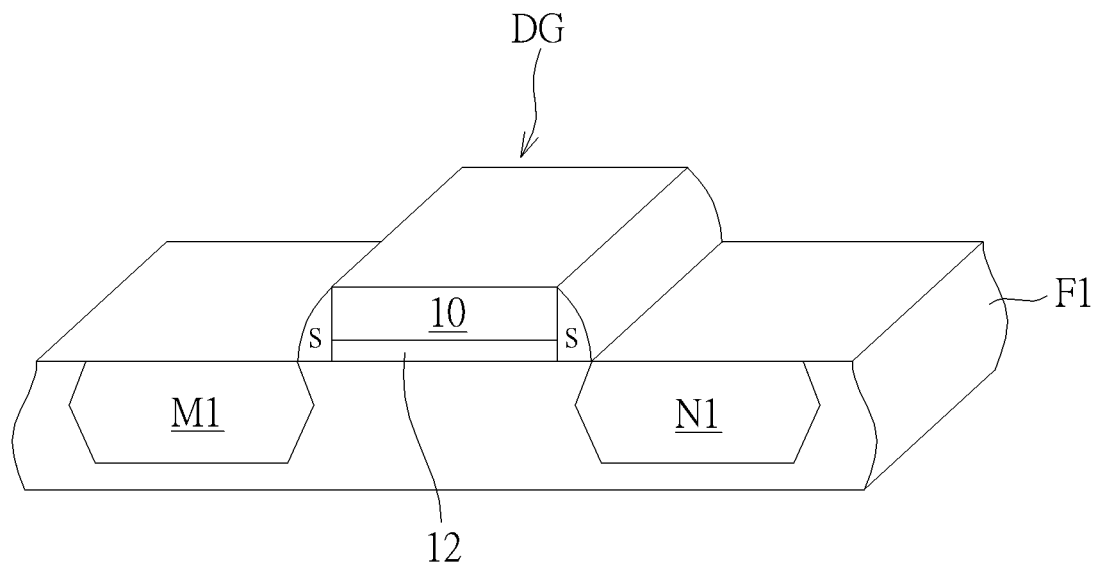
Figure 2:
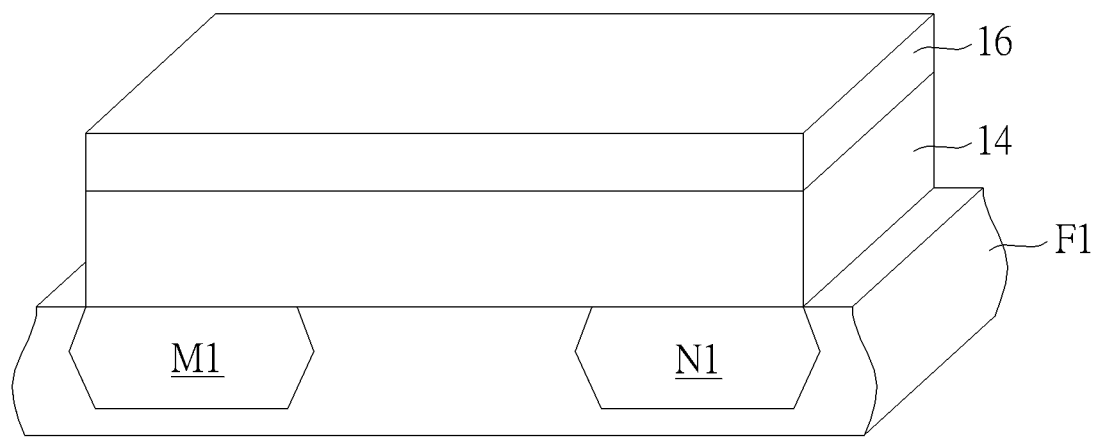

As shown in FIG. 1, a fin structure F1 is provided. A dummy gate DG is disposed on the fin structure F1. Two spacers S are disposed at two sides of the dummy gate DG. A first embed epitaxial layer M1 and a second embed epitaxial layer N1 are respectively embedded within the fin structure F1 at two sides of the dummy gate DG. The dummy gate DG may include a polysilicon gate 10 and a gate dielectric layer 12. The gate dielectric layer 12 is disposed between the polysilicon gate 10 and the fin structure F1. The fin structure F1 can be semiconductor material such as silicon, germanium, gallium arsenide, silicon germanium or indium phosphide. As shown in FIG. 2, a first epitaxial layer 14 and a second epitaxial layer 16 are formed in sequence to cover the fin structure F1 and the dummy gate DG. The first epitaxial layer 14 contacts the top surface of the first embed epitaxial layer M1 and the top surface of the second embed epitaxial layer N1. Now, the dummy gate DG is encapsulated within the first epitaxial layer 14 and the second epitaxial layer 16.

Figure 3:
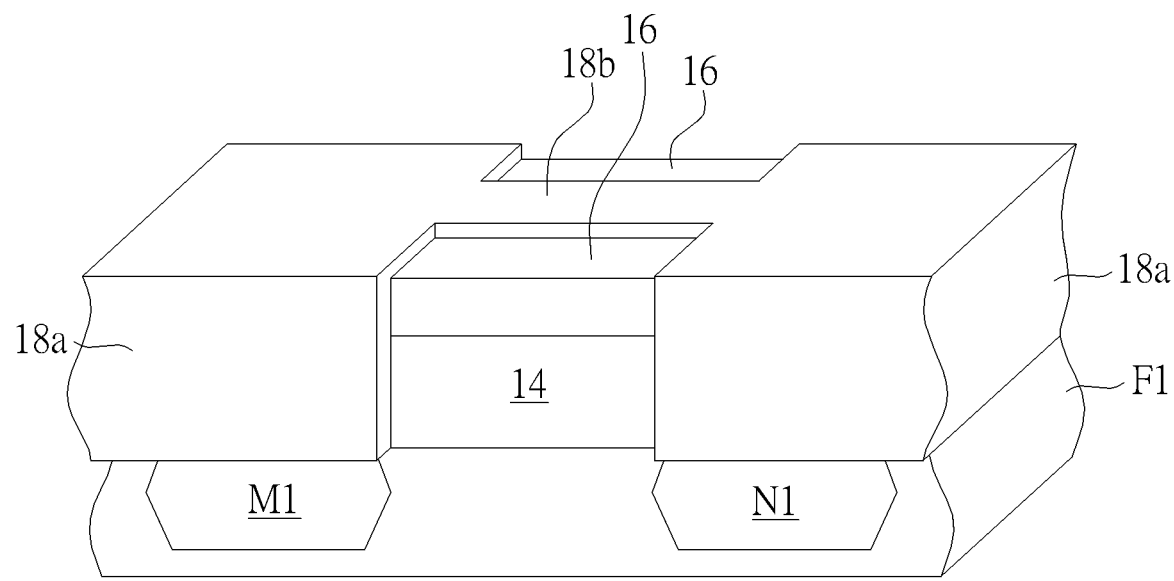

As shown in FIG. 3, two first mask layers 18a and one second mask layer 18b are formed simultaneously. The first mask layers 18a and the second mask layer 18b may be photoresist, silicon nitride or silicon oxynitride. Each of the first mask layers 18a respectively encapsulates the first epitaxial layer 14 and the second epitaxial layer 16 directly on the first embed epitaxial layer M1 and the first epitaxial layer 14 and the second epitaxial layer 16 directly on the second embed epitaxial layer N1. In details, the top surface and the sidewall of the second epitaxial layer 16 contact the first mask layers 18a. The top surface of the first epitaxial layer 14 does not contact the first mask layers 18a, only the sidewall of the first epitaxial layer 14 contacts the first mask layers 18a. There is part of the first epitaxial layer 14 and part of the second epitaxial layer 16 between the two first mask layers 18a are not covered by the first mask layers 18a. The second mask layer 18b covers the second epitaxial layer 16 directly on the dummy gate DG. The second mask layer 18b connects the two first mask layers 18a. The second mask layer 18b is at the middle of the top surface of the second epitaxial layer 16 to make two ends of the second epitaxial layer 16 exposed. The sidewall of the first epitaxial layer 14 and the sidewall of the second epitaxial layer 16 do not contact the second mask layer 18b.

Figure 4:
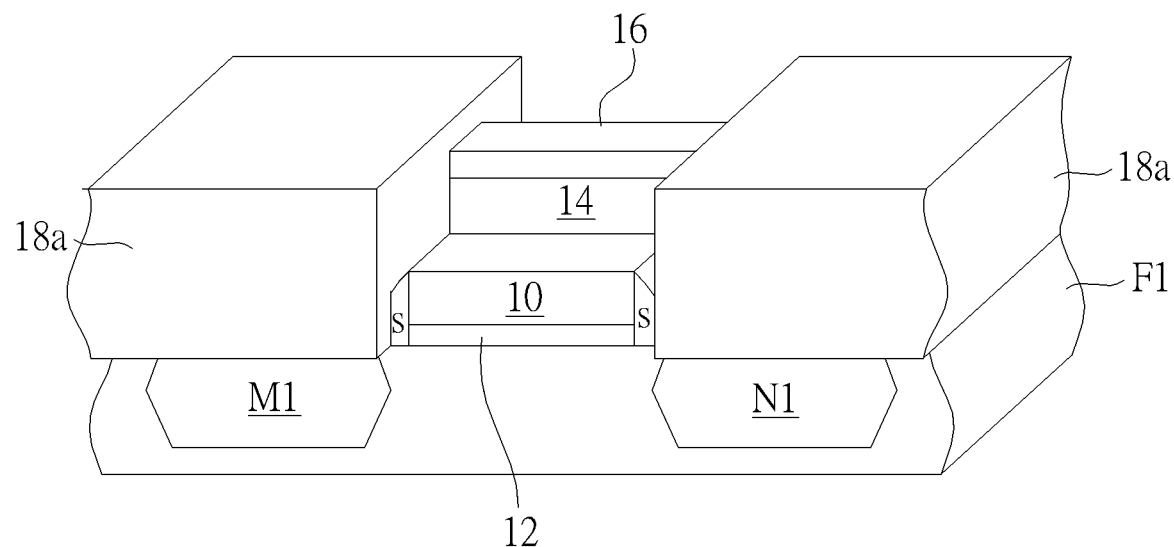
Figure 5:
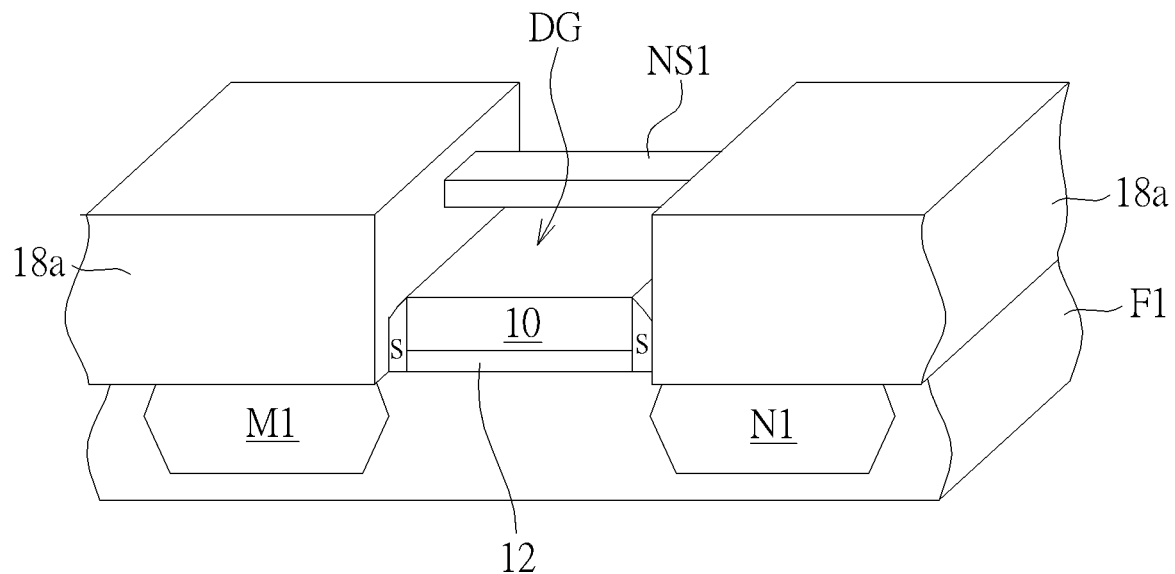

As shown in FIG. 4, the first epitaxial layer 14 and the second epitaxial layer 16 are thinned by taking the two first mask layers 18a and the second mask layer 18b as a mask. The thinning process is preferably performed by a plasma etching. During the etching, because the second mask layer 18b is consumed entirely, the second epitaxial layer 16 originally covered by the second mask layer 18b is partly etched. After the thinning process, the first epitaxial layer 14 and the second epitaxial layer 16 are both in a shape of a flat board. As shown in FIG. 5, the first epitaxial layer 14 not covered by the first mask layers 18a are removed through a wet etching by taking the first mask layers 18a as a mask to make the remaining second epitaxial layer 16 to form a nanosheet NS1 and expose the dummy gate DG and the spacers S. During the wet etching, because the first epitaxial layer 14 needs to be removed but the second epitaxial layer 16 needs to be kept, material of the first epitaxial layer 14 and the second epitaxial layer 16 are different. Furthermore, as shown in FIG. 10, the first epitaxial layer 14 remains on the first embed epitaxial layer M1 becomes a first source/drain lower epitaxial layer M2. The first epitaxial layer 14 remains on the second embed epitaxial layer N1 becomes a second source/drain lower epitaxial layer N2. The second epitaxial layer 16 remains directly on the first embed epitaxial layer M1 becomes a first source/drain upper epitaxial layer M3. The second epitaxial layer 16 remains directly on the second embed epitaxial layer N1 becomes a second source/drain upper epitaxial layer N3.

Figure 6:
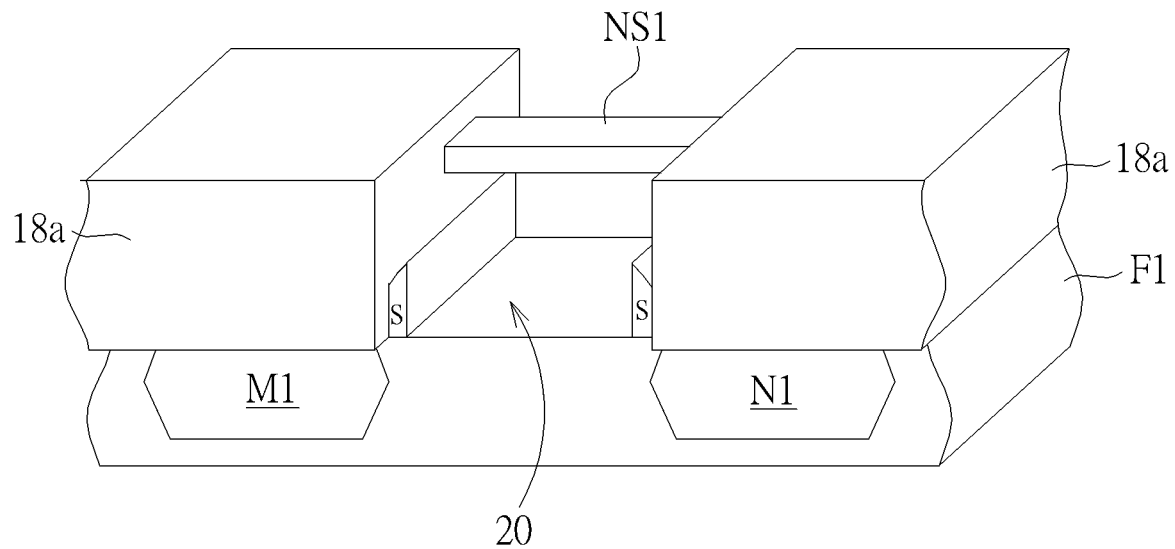
Figure 7:
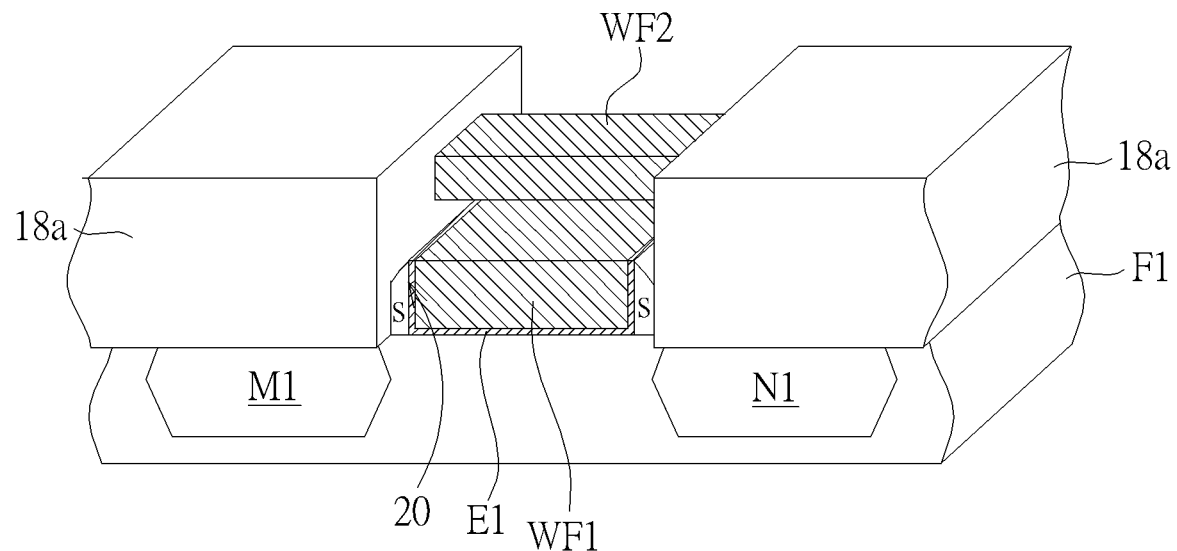

As shown in FIG. 6, another wet etching is performed to remove the dummy gate DG to form a recess 20 between the spacers S. As shown in FIG. 7, a first gate dielectric layer E1 and a second dielectric layer E2 are formed simultaneously. The second gate dielectric layer E2 encapsulates the nanosheet NS1, and the first gate dielectric layer E1 conformally covers the recess 20. Later, a first gate portion WF1 and a second gate portion WF2 are formed simultaneously to respectively cover the first dielectric layer E1 and the second gate dielectric layer E2. Please refer to FIG. 10 for detailed positions of the first gate dielectric layer E1 and the second gate dielectric layer E2. Because the first gate dielectric layer E1 and the second gate dielectric layer E2 are formed simultaneously, materials of the first gate dielectric layer E1 and the second gate dielectric layer E2 are the same. The first gate dielectric layer E1 and the second gate dielectric layer E2 include silicon oxide, silicon germanium, hafnium oxide or other dielectrics. The first gate portion WF1 fills in the recess 20. The second gate portion WF2 encapsulates the nanosheet NS1. Materials of the first gate portion WF1 and the second gate portion WF2 are the same. The first gate portion WF1 and the second gate portion WF2 will serve as work function layers in the transistor of the present invention.

As shown in FIG. 8, a gate electrode MG is formed to fill up a space between the first mask layers 18a. As shown in FIG. 9, the first mask layers 18a are entirely removed. Now, a transistor T1 with a fin structure and a nanosheet of the present invention is completed. The process mentioned above is suitable of manufacturing both P-type and N-type transistors. If a P-type transistor is to be formed, the first embed epitaxial layer M1 and the second embed epitaxial layer N1 are preferably silicon germanium. The first epitaxial layer 14 is preferably silicon germanium doped with boron. The second epitaxial layer 16 is preferably germanium. The first gate portion WF1 and the second gate portion WF2 includes WN, RuN, MON, TIN, TaN, WC, TaC, TiC, TiAlN or TaAlN. If an N-type transistor is to be formed, the first embed epitaxial layer M1 and the second embed epitaxial layer N1 are preferably silicon phosphide. The first epitaxial layer 14 is preferably silicon germanium doped with phosphorus. The second epitaxial layer 16 is preferably germanium. The first gate portion WF1 and the second gate portion WF2 include TiN or TaN.

FIG. 10 depicts a transistor with a fin structure and a nanosheet according to a preferred embodiment of the present invention. FIG. 10 is a sectional view taken along line AA' in FIG. 9, wherein elements which are substantially the same as those in the embodiment of FIG. 9 are denoted by the same reference numerals; an accompanying explanation is therefore omitted.

As shown in FIG. 10, the transistor T1 with a fin structure and a nanosheet includes the fin structure F1. The first gate portion WF1 is disposed on the fin structure F1. The first gate dielectric layer E1 is disposed between the fin structure F1 and the first gate portion WF1. The first gate dielectric layer E1 is preferably in a U shape. Two spacers S are disposed at two sides of the first gate portion WF1. A first source/drain layer M is disposed at one side of the first gate portion WF1, wherein the first source/drain layer M is on the fin structure F1 and extends into the fin structure F1. In details, the first source/drain layer M includes the first embed epitaxial layer M1, the first source/drain lower epitaxial layer M2 and the first source/drain upper epitaxial layer M3 disposed from bottom to top. The first embed epitaxial layer M1 is embedded within the fin structure F1. The first source/drain lower epitaxial layer M2 is disposed on a top surface of the fin structure F1 and contacts the first embed epitaxial layer M1. The first source/drain upper epitaxial layer M3 is disposed on the first source/drain lower epitaxial layer M2 and contacts the first source/drain lower epitaxial layer M2. A second source/drain layer N is disposed at another side of the first gate portion WF1, wherein the second source/drain layer N is on the fin structure F1 and extends into the fin structure F1. In details, the second source/drain layer N includes the second embed epitaxial layer N1, the second source/drain lower epitaxial layer N2 and the second source/drain upper epitaxial layer N3 disposed from bottom to top. The second embed epitaxial layer N1 is embedded within the fin structure F1. The second source/drain lower epitaxial layer N2 is disposed on a top surface of the fin structure F1 and contacts the second embed epitaxial layer N1. The second source/drain upper epitaxial layer N3 is disposed on the second source/drain lower epitaxial layer N2 and contacts the second source/drain lower epitaxial layer N2. A nanosheet NS1 is disposed above the first gate portion WF1, wherein the nanosheet NS1 is disposed between and contacts the first source/drain layer M and the second source/drain layer N. The nanosheet NS1 connects to the first source/drain upper epitaxial layer M3 and the second source/drain upper epitaxial layer N3. The second gate dielectric layer E2 surrounds and contacts the nanosheet NS1. The second gate portion WF2 surrounds the nanosheet NS1 and contacts the second gate dielectric layer E2. The metal gate MG is disposed between first source/drain layer M and the second source/drain layer N. The metal gate MG contacts the first gate portion WF1 and the second gate portion WF2. Moreover, material of the first source/drain lower epitaxial layer M2 is different from material of the first source/drain upper epitaxial layer M3. The first gate portion WF1 and the second gate portion WF2 serve as work function layer in the transistor T1 with a fin structure and a nanosheet. The metal gate MG serves as an electrode connects to gate voltage.

If the transistor T1 with a fin structure and a nanosheet is a P-type transistor, the first embed epitaxial layer M1 and the second embed epitaxial layer N1 are preferably silicon germanium. The first source/drain lower epitaxial layer M2 and the second source/drain lower epitaxial layer N2 are preferably silicon germanium doped with boron. The first source/drain upper epitaxial layer M3 and the second source/drain upper epitaxial layer N3 are preferably germanium. On the other hand, when the transistor T1 with a fin structure and a nanosheet is an N-type transistor, the first embed epitaxial layer M1 and the second embed epitaxial layer N1 are preferably silicon phosphide. The first source/drain lower epitaxial layer M2 and the second source/drain lower epitaxial layer N2 are preferably silicon germanium doped with phosphorus. The first source/drain upper epitaxial layer M3 and the second source/drain upper epitaxial layer N3 are preferably germanium.

When applying voltage to the gate electrode MG to turn on the transistor T1 with a fin structure and a nanosheet, two channels are generated. The first channel C1 is in the fin structure F1 between the first embed epitaxial layer M1 and the second embed epitaxial layer N1. The second channel C2 is in the nanosheet NS1 between the first source/drain upper epitaxial layer M3 and the second source/drain upper epitaxial layer N3. That is, there are two channels are generated between the first source/drain layer M and the second source/drain layer N at the same time. Comparing to the conventional FinFet, the transistor T1 with a fin structure and a nanosheet increases current density.

Figure 11:
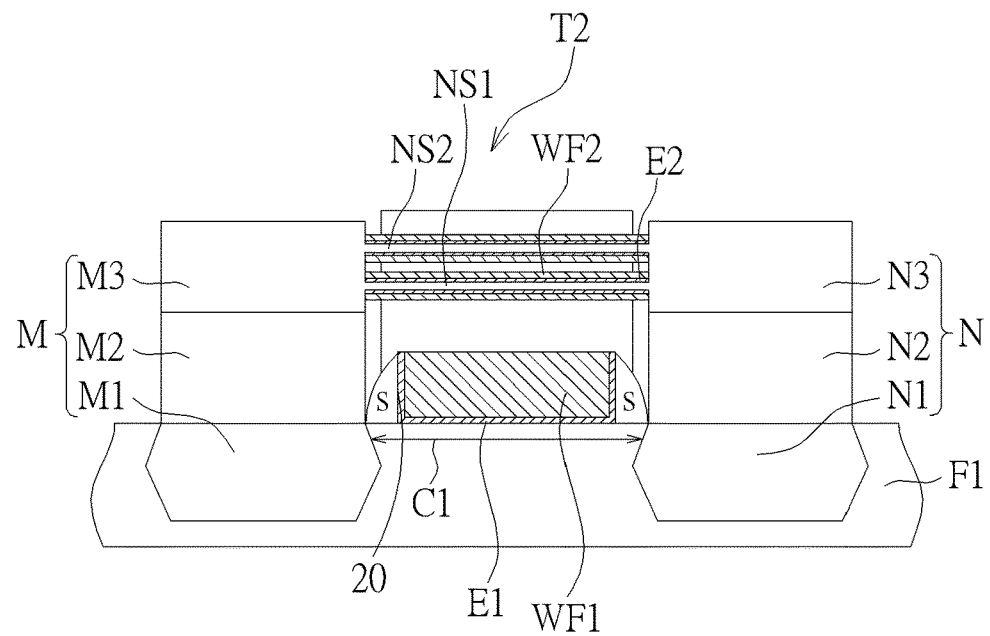
FIG. 11 depicts a transistor with a fin structure and a nanosheet according to a second preferred embodiment of the present invention.

FIG. 11 depicts a transistor with a fin structure and a nanosheet according to a second preferred embodiment of the present invention, wherein elements which are substantially the same as those in the embodiment of FIG. 9 are denoted by the same reference numerals; an accompanying explanation is therefore omitted. As shown in FIG. 11, a transistor T2 with a fin structure and a nanosheet includes two nanosheets NS1/NS2. The nanosheet NS2 is above the nanosheet NS1. The nanosheet NS2 contacts the first source/drain layer M and the second source/drain layer N. More specifically speaking, the nanosheet NS2 contacts the first source/drain upper epitaxial layer M3 and the second source/drain upper epitaxial layer N3.

Figure 12:
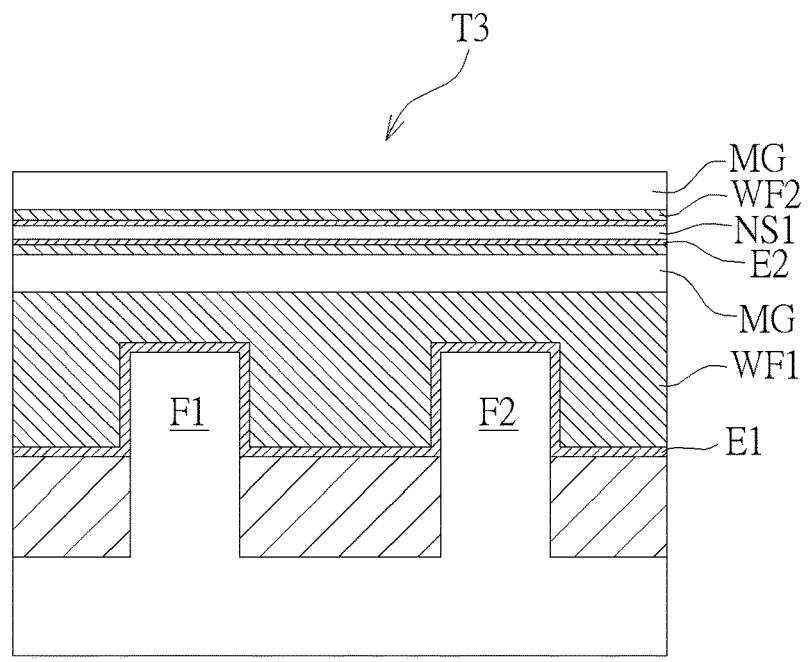
FIG. 12 depicts a transistor with a fin structure and a nanosheet according to a third preferred embodiment of the present invention.

FIG. 12 depicts a transistor with a fin structure and a nanosheet according to a third preferred embodiment of the present invention. Please refer to FIG. 9, along a Y direction, there can be numerous fin structures. The Y direction is perpendicular to the extending direction of the fin structure F1. As shown in FIG. 12 and FIG. 9, the difference between the transistor T3 with a fin structure and a nanosheet and the transistor T1 with a fin structure and a nanosheet is that along the Y direction, there is fin structure F2 (second fin structure) in the transistor T3 with a fin structure and a nanosheet. The fin structure F2 (second fin structure) is parallel to the fin structure F1 (first fin structure). The first gate portion WF1 extends to the fin structure F2. The second gate portion WF2 extends to the fin structure F2. The nanosheet NS1 extends to the fin structure F2. The first source/drain layer (not shown) extends to the fin structure F2. The second source/drain layer (not shown) extends to the fin structure F2.

Those skilled in the art will readily observe that numerous modifications and alterations of the device and method may be made while retaining the teachings of the and bounds of the appended claims.

What is claimed is:

1. A transistor with a first fin structure and a first nanosheet, comprising:
   a first fin structure;
   a first gate portion disposed on the first fin structure;
   a first source/drain layer disposed at one side of the first gate portion, wherein the first source/drain layer is on the first fin structure and extends into the first fin structure;
   a second source/drain layer disposed at another side of the first gate portion, wherein the second source/drain layer is on the first fin structure and extends into the first fin structure;
   a first nanosheet disposed above the first gate portion, wherein the first nanosheet is disposed between and contacts the first source/drain layer and the second source/drain layer; and
   a second gate portion surrounding the first nanosheet and separating from the first gate portion.

2. The transistor with the first fin structure and the first nanosheet of claim 1, further comprising a gate electrode disposed between the first source/drain layer and the second source/drain layer, wherein the gate electrode contacts the first gate portion and the second gate device-portion.

3. The transistor with the first fin structure and the first nanosheet of claim 1, wherein the first source/drain layer comprises a first embed epitaxial layer embedded within the first fin structure, a first source/drain lower epitaxial layer disposed on a top surface of the first fin structure and a first source/drain upper epitaxial layer disposed on the first source/drain lower epitaxial layer, the second source/drain layer comprises a second embed epitaxial layer embedded within the first fin structure, a second source/drain lower epitaxial layer disposed on the top surface of the first fin structure and a second source/drain upper epitaxial layer disposed on the second source/drain lower epitaxial layer.

4. The transistor with the first fin structure and the first nanosheet of claim 3, wherein the first nanosheet connects to the first source/drain upper epitaxial layer and connects to the second source/drain upper epitaxial layer.

5. The transistor with the first fin structure and the first nanosheet of claim 3, wherein the first source/drain lower epitaxial layer and the first source/drain upper epitaxial layer are made of different materials.

6. The transistor with the first fin structure and the first nanosheet of claim 3, wherein the transistor with the first fin structure and the first nanosheet is a P-type transistor, the first embed epitaxial layer is silicon germanium, the first source/drain lower epitaxial layer is silicon germanium doped with boron, and the first source/drain upper epitaxial layer is germanium.

7. The transistor with the first fin structure and the first nanosheet of claim 3, wherein the transistor with the first fin structure and the first nanosheet is an N-type transistor, the first embed epitaxial layer is silicon phosphide, the first source/drain lower epitaxial layer is silicon germanium doped with phosphorus, and the first source/drain upper epitaxial layer is germanium.

8. The transistor with the first fin structure and the first nanosheet of claim 1, further comprising a second fin structure parallel to the first fin structure, wherein the first gate portion extends to the second fin structure and the first nanosheet extends to the second fin structure.

9. The transistor with the first fin structure and the first nanosheet of claim 1, further comprising:
a first gate dielectric layer disposed between the first fin structure and the first gate portion;
a second gate dielectric layer disposed between the first nanosheet and the second gate portion; and
two spacers respectively disposed at two sides of the first gate portion.

10. The transistor with the first fin structure and the first nanosheet of claim 1, further comprising: a second nanosheet disposed on the first nanosheet, the second nanosheet contacts the first source/drain layer and the second source/drain layer.

11. The transistor with the first fin structure and the first nanosheet of claim 1, further comprising a metal gate contacting the first gate portion and the second gate portion.

12. The transistor with the first fin structure and the first nanosheet of claim 11, wherein the metal gate is disposed between first source/drain layer and the second source/drain layer.

13. The transistor with the first fin structure and the first nanosheet of claim 11, further comprising two spacers respectively disposed at two sides of the first gate portion, and wherein the metal gate contacts the two spacers.

14. The transistor with the first fin structure and the first nanosheet of claim 1, wherein materials of the first gate portion and the second gate portion are the same.

15. The transistor with the first fin structure and the first nanosheet of claim 1, wherein the first gate portion and the second gate portion serve as work function layers in the transistor with the first fin structure and the first nanosheet.

16. The transistor with the first fin structure and the first nanosheet of claim 3, wherein there is a first channel in the first fin structure between the first embed epitaxial layer and the second embed epitaxial layer, and a second channel in the first nanosheet between the first source/drain upper epitaxial layer and the second source/drain upper epitaxial layer when applying voltage to turn on the transistor with the first fin structure and the first nanosheet.

* * * * *